(12) United States Patent
Ma et al.

(10) Patent No.: US 12,075,583 B2
(45) Date of Patent: Aug. 27, 2024

(54) ELECTRONIC DEVICE HOUSING, ELECTRONIC DEVICE, AND COMPOUND BODY

(71) Applicant: BYD COMPANY LIMITED, Guangdong (CN)

(72) Inventors: Lan Ma, Shenzhen (CN); Haiyan Jin, Shenzhen (CN); Ling Pan, Shenzhen (CN); Na Yu, Shenzhen (CN); Liang Chen, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 597 days.

(21) Appl. No.: 17/281,189

(22) PCT Filed: May 16, 2019

(86) PCT No.: PCT/CN2019/087230
§ 371 (c)(1),
(2) Date: Mar. 29, 2021

(87) PCT Pub. No.: WO2020/062890
PCT Pub. Date: Apr. 2, 2020

(65) Prior Publication Data
US 2021/0400831 A1    Dec. 23, 2021

(30) Foreign Application Priority Data

Sep. 30, 2018 (CN) .......................... 201811161748.4

(51) Int. Cl.
*H05K 5/06* (2006.01)
*C03C 8/08* (2006.01)
(Continued)

(52) U.S. Cl.
CPC ................. *H05K 5/06* (2013.01); *C03C 8/08* (2013.01); *C03C 8/24* (2013.01); *C04B 37/045* (2013.01);
(Continued)

(58) Field of Classification Search
CPC ........... C03C 27/044; C03C 8/08; C03C 8/24; C04B 2237/06; C04B 2237/10;
(Continued)

(56) References Cited

U.S. PATENT DOCUMENTS

2001/0038365 A1\* 11/2001 Igeta ........................ H01J 11/48
345/60
2004/0043225 A1   3/2004 Bauer et al.
(Continued)

FOREIGN PATENT DOCUMENTS

CN      203167461 U    8/2013
CN      203872220 U    10/2014
(Continued)

OTHER PUBLICATIONS

International Search Report and Written Opinion, PCT/CN2019/087230, dated Jul. 25, 2019, 8 pages.

*Primary Examiner* — Nguyen T Vo

(57) ABSTRACT

An electronic device housing, an electronic device and a compound body are provided. The electronic device housing comprises a frame; a sealing layer, disposed on at least a part of an outer surface of the frame, and including a plurality of sub-sealing layers laminated in sequence; and a back case, attached to the frame by the sealing layer, wherein two adjacent sub-sealing layers have different compositions.

15 Claims, 4 Drawing Sheets

(51) Int. Cl.
*C03C 8/24* (2006.01)
*C04B 37/04* (2006.01)
*H04M 1/02* (2006.01)
*H05K 5/02* (2006.01)

(52) U.S. Cl.
CPC .......... *H04M 1/026* (2013.01); *H05K 5/0217* (2013.01); *C04B 2237/10* (2013.01); *C04B 2237/343* (2013.01)

(58) Field of Classification Search
CPC ........ C04B 2237/343; C04B 2237/348; C04B 2237/406; C04B 37/025; C04B 37/045; H04M 1/0202; H04M 1/026; H05K 5/0217; H05K 5/06
See application file for complete search history.

(56) References Cited

U.S. PATENT DOCUMENTS

| | | | |
|---|---|---|---|
| 2011/0209813 A1* | 9/2011 | Shibuya | H10K 30/88 156/89.12 |
| 2011/0318591 A1 | 12/2011 | Fihhong | |
| 2013/0111953 A1 | 5/2013 | Maloney et al. | |
| 2014/0023803 A1 | 1/2014 | Kawanami et al. | |
| 2014/0026619 A1* | 1/2014 | Maloney | C03C 23/001 65/43 |
| 2016/0322597 A1* | 11/2016 | Gong | C03C 8/24 |
| 2018/0103557 A1 | 4/2018 | Wright et al. | |
| 2018/0147787 A1* | 5/2018 | Shiragami | B29C 65/16 |
| 2019/0239374 A1* | 8/2019 | Cha | H10K 77/111 |
| 2019/0342645 A1* | 11/2019 | Jung | H04M 1/18 |

FOREIGN PATENT DOCUMENTS

| | | |
|---|---|---|
| CN | 104409330 A | 3/2015 |
| CN | 104780241 A | 7/2015 |
| CN | 106325382 A | 1/2017 |
| CN | 106657505 A | 5/2017 |
| CN | 107613069 A | 1/2018 |
| CN | 207185012 U | 4/2018 |
| CN | 108219681 A | 6/2018 |
| EP | 0982278 A1 | 3/2000 |
| EP | 1844512 A1 | 10/2007 |
| JP | H01225140 A | 9/1989 |
| JP | 2003-046012 A | 2/2003 |
| JP | 2003-158208 A | 5/2003 |
| JP | 2008-022655 A | 1/2008 |
| JP | 47-34707 A | 7/2011 |
| TW | M456284 U | 7/2013 |
| WO | WO 2012/117978 A1 | 9/2012 |
| WO | 2017/179381 A1 | 10/2017 |

* cited by examiner

ELECTRONIC DEVICE HOUSING, ELECTRONIC DEVICE, AND COMPOUND BODY

CROSS-REFERENCE TO RELATED APPLICATIONS

The present application is a 35 U.S.C. 371 Patent Application of PCT Application No. PCT/CN2019/087230, titled "ELECTRONIC DEVICE HOUSING, ELECTRONIC DEVICE, AND COMPOUND BODY", filed on May 16, 2019 which claims priority to and benefits of Chinese Patent Application Serial Number 201811161748.4 filed with the State Intellectual Property Office of P. R. China on Sep. 30, 2018. The entire content of the above-referenced applications are incorporated herein by reference.

FIELD

This application relates to the technical field of electronic devices, and in particular to an electronic device housing, an electronic device and a compound body.

BACKGROUND

In recent years, with the rise of 5G and wireless charging technologies, electronic devices have increasingly high requirements for signals. At present, electronic device housings, such as mobile phone housings, are mostly made from metal materials. Metals have a strong shielding effect on electromagnetic signals, so that the signals cannot effectively travel through the electronic device housings, making the existing electronic device housings fail to satisfy the consumer experience of users.

Therefore, the existing electronic device housings still need improvement.

SUMMARY

This application proposes an electronic device housing. In the electronic device housing, a frame and a back case of different materials are bonded by a sealing layer. The bonding effect is good, the appearance is aesthetic, the signal shielding effect is weak, and the mechanical properties are good. Therefore, the electronic device housing has a wide scope of application or a long service life, and can satisfy the consumer experience of users.

In an aspect of this application, this application provides an electronic device housing. According to an embodiment of the present application, the electronic device housing includes: a frame; a sealing layer, disposed on at least a part of an outer surface of the frame, and including a plurality of sub-sealing layers laminated in sequence; and a back case, attached to the frame by the sealing layer, where two adjacent sub-sealing layers have different compositions. The inventors find that the back case and the frame in the electronic device housing are bonded firmly, the mechanical properties are good, and the appearance is aesthetic. The frame and the back case formed of different materials and having large difference in thermal expansion coefficients can be firmly bonded together by the sealing layer with sub-sealing layers each having different compositions. The difference between the thermal expansion coefficients of two adjacent layer structures is small, the degree of match is high, the possibility of failures due to temperature changes is significantly reduced, the service life is long, and the requirement for signals during use can be well satisfied to avoid the problem of signal shielding. Therefore, the present application can not only meet the increasingly higher aesthetic requirement of the users, but also have better usability to improve the user experience.

In another aspect of this application, this application provides an electronic device. According to an embodiment of the present application, the electronic device includes the electronic device housing as described above. The inventors find that the electronic device has a simple structure, is easy to implement, can attain 5G and wireless charging functions, and has a strong ability to receive or transmit signals, a long service life, all the features and advantages of the aforementioned electronic device housing, and thus high market competitiveness.

This application provides a compound body. According to an embodiment of the present application, the compound body includes: a first workpiece; a sealing layer, disposed on at least a part of an outer surface of the first workpiece, and including a plurality of sub-sealing layers laminated in sequence, where two adjacent sub-sealing layers have different compositions; and a second workpiece, attached to the first workpiece by the sealing layer. The inventors find that the bonding force between the first workpiece and the second workpiece in the compound body is strong. The first workpiece and the second workpiece formed of different materials and having large difference in thermal expansion coefficients are firmly bonded together by the sealing layer with sub-sealing layers each having different compositions. The difference between the thermal expansion coefficients of two adjacent structures is small, the degree of match is high, the possibility of failures of the compound body due to temperature changes is significantly reduced, the mechanical properties are desirable, the service life is long, the appearance is aesthetic, the strength is high, and the signal shielding effect is weak. Thus, a compound body with better use effect is obtained, which is suitable for use in the production of electronic device housings.

DETAILED DESCRIPTION

Embodiments of this application are described in detail below. The embodiments described below are exemplary, and are only intended to explain this application rather than being construed as limitation to this application. Where specific techniques or conditions are not indicated in the examples, the procedures shall be carried out in accordance with the techniques or conditions described in the literatures in the field or in accordance with the product specification. The reagents or instruments for which no manufacturers are noted are all common products commercially available from the market.

This application is accomplished based on the following knowledge and findings of the present inventors.

At present, electronic device housings, such as mobile phone housings, are mostly produced by processing of all-metal pieces, injection of an inorganic piece (such as glass or ceramic) on a metal piece, and bonding of a metal piece and an inorganic piece (such as glass or ceramic) by dispensing an adhesive between a touch panel (TP) and a frame. The produced electronic device housing has low strength and poor bonding force between the metal piece and the inorganic piece, is prone to damage, and has a short service life. In view of the above technical problems, the present inventors find after in-depth research that in order to improve the bonding force between the metal piece and the inorganic piece, the sealing layer between the metal piece and the inorganic piece can be set to have a multilayer structure, and by means of each of the sub-sealing layers having different compositions, the difference between the thermal expansion coefficients of two adjacent structures can be adjusted, so that the degree of match between two adjacent structures is high, and the probability of damage is greatly reduced, thereby enhancing the bonding force. In addition, the metal piece may be pretreated firstly to obtain a bonding promotion layer having a stronger bonding force between the bonding promotion layer and the sealing layer on its surface, thereby achieving a stronger bonding force between the metal piece and the inorganic piece.

Figure 1:
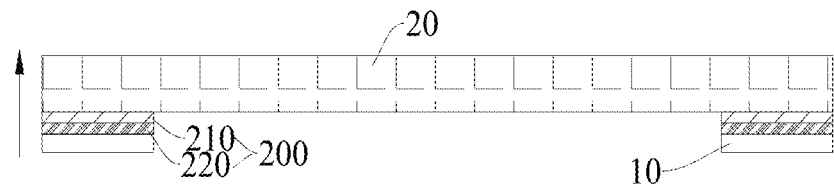
FIG. 1 is a schematic structural diagram of an electronic device housing according to an embodiment of the present application.
Figure 2:
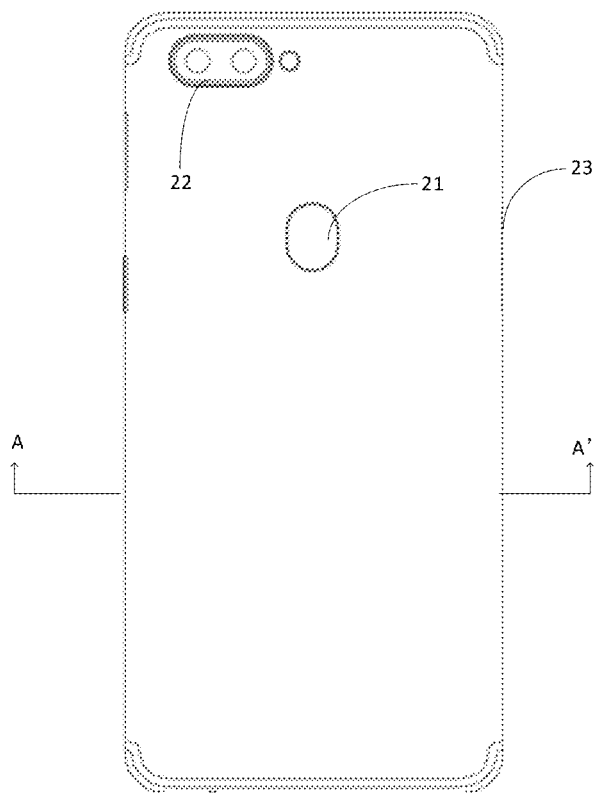
FIG. 2 is a schematic structural diagram of an electronic device according to an embodiment of the present application.

In an aspect of this application, this application provides an electronic device housing. According to an embodiment of the present application, referring to FIG. 1 (FIG. 1 corresponds to a cross-sectional view along the line A-A' in FIG. 2) and FIG. 2, the electronic device housing includes: a frame 10; a sealing layer 200, disposed on at least a part of an outer surface of frame 10, and including a plurality of sub-sealing layers laminated in sequence (where two sub-sealing layers 210 and 220 are taken as examples for description in FIG. 1), where two adjacent sub-sealing layers have different compositions; and a back case 20, attached to the frame 10 by the sealing layer 200. The inventors find that the back case and the frame in the electronic device housing are bonded firmly, the mechanical properties are good, and the appearance is aesthetic. The compatibility between the thermal expansion coefficients of the sub-sealing layers and the back case or the frame can be flexibly adjusted by the sub-sealing layers having different compositions. Therefore, the frame and the back case formed of different materials and having large difference in thermal expansion coefficients can be firmly bonded together by the sealing layer. The difference between the thermal expansion coefficients of two adjacent structures is small, the degree of match is high, the possibility of failures due to temperature changes is significantly reduced, the bonding strength is high, the service life is long, and the requirement for signals during use can be well satisfied to avoid the problem of signal shielding. Therefore, the present application can not only meet the increasingly higher aesthetic requirement of the users, but also have better usability to improve the user experience.

It should be noted that the expression "adjacent two structures" used herein refers to any two adjacent layers in the electronic device housing or the compound body described later, for example, including, but not limited to, the frame and the sub-sealing layer adjacent thereto, two adjacent sub-sealing layers, the back case and the sub-sealing layer adjacent thereto. The expression "two adjacent sub-sealing layers have different compositions" means that the components contained in two adjacent sub-sealing layers are different and/or the content of each component is different. The expression "the difference between the thermal expansion coefficient of two adjacent structures is within ±10%" means that the difference between the thermal expansion coefficients of two adjacent structures divided by the larger one of the thermal expansion coefficients of two adjacent structures is less than or equal to 10%. Specifically, referring to FIG. 1, the frame 10 and the sub-sealing layer 220 are two adjacent structures. The difference between the thermal expansion coefficients of the two=(thermal expansion coefficient of frame 10−thermal expansion coefficient of sub-sealing layer 220)/the larger one of the thermal expansion coefficients of the frame 10 and the sub-sealing layer 220. The expression "the direction of distribution of the frame, the sealing layer and the back case" refers to the direction of arrangement (or lamination) of the frame, the sealing layer and the back case, specifically, see the direction shown by the arrow in FIG. 1, and other similar descriptions have the same meaning.

According to an embodiment of the present application, to allow the thermal expansion coefficients between different layer structures in the electronic device housing to have a high degree of match, the thermal expansion coefficient of the sealing layer 200 is between the thermal expansion coefficients of the frame 10 and the back case 20, and the difference between the thermal expansion coefficients of adjacent two structures of the frame 10, the plurality of sub-sealing layers and the back case 20 is within ±10%. As a result, the thermal expansion coefficient of each layer structure is well matched, and the bonding force between frame and the back case is stronger. In some embodiments of the present application, in the direction of distribution of the frame 10, the sealing layer 200 and the back case 20 (see the direction indicated by the arrow in FIG. 1), the thermal expansion coefficients of the plurality of sub-sealing layers increase or decrease in gradient. As a result, the thermal expansion coefficient of each layer structure gradually changes and is well matched, and the bonding force between the frame and the back case is stronger, to well buffer the mismatched thermal expansion coefficients between the back case and the frame, and well improve various failures and defects caused by thermal shock. Therefore, the mechanical properties of the electronic device housing are better, and the probability of damage is significantly reduced. Specifically, when the thermal expansion coefficient of the frame is greater than the thermal expansion coefficient of the back case, the thermal expansion coefficients of the plurality of sub-sealing layers decrease in gradient in the above direction. When the thermal expansion coefficient of the frame is smaller than the thermal expansion coefficient of the back case, the thermal expansion coefficients of the plurality of sub-sealing layers increase in gradient in the above direction. Thus, the thermal expansion coefficient in the direction from the frame to the back case can be increased or decreased gradually, which significantly improves various problems caused by thermal expansion.

Figure 3:
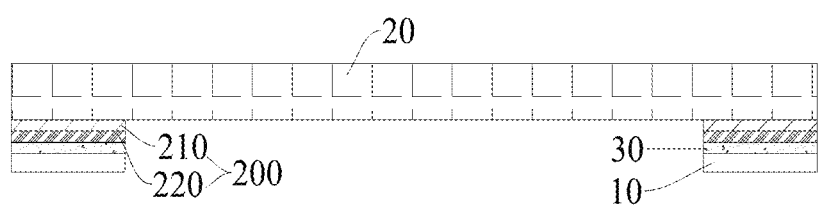
FIG. 3 is a schematic structural diagram of an electronic device housing according to another embodiment of the present application.

According to an embodiment of the present application, the frame is a metal frame, and the back case is an inorganic back case. Referring to FIG. 3, a bonding promotion layer 30 is further provided between the metal frame 10 and the sealing layer 200. As a result, the bonding between the metal frame and the inorganic back case is obviously promoted, the binding force is strong, seamless and stepless bonding is realized, the mechanical properties of the housing are good, and the appearance is aesthetic. According to an embodiment of the present application, in order to further improve the bonding force between the metal frame and the inorganic back case, the bonding promotion layer satisfies at least one of the conditions that the bonding promotion layer and the sealing layer are similar and intermiscible, the surface of the bonding promotion layer away from the metal frame has a concave-convex structure; and the bonding promotion layer has a porous structure. Accordingly, the similar and intermiscible allows for a good infiltrability between the bonding promotion layer and the sealing layer, the concave-convex structure can effectively increase the bonding force between the bonding promotion layer and the sealing layer, and the porous structure permits a part of the sealing layer to fill in the porous structure, to further increase the bonding force between the bonding promotion layer and the sealing layer. Therefore, the obtained housing has better bonding strength and better usability.

According to an embodiment of the present application, the material forming the metal frame includes aluminum alloy or stainless steel. As such, the material is widely available, and has lower price, higher strength and better usability. In some embodiments of the present application, the stainless steel may be selected from at least one of SUS301 stainless steel, SUS304 stainless steel, and SUS316L stainless steel, or selected from at least one of the stainless steel designations S30110, S30408, S31603, and others in "GB/T 20878-2007 Stainless and heat-resisting steels—Designation and chemical composition". The aluminum alloy can be selected from 5052 aluminum alloy, 5182 aluminum alloy, 6063 aluminum alloy, 6061 aluminum alloy, 6013 aluminum alloy, the 7 series aluminum alloys with a zinc content in the range of 1%-10%, and so on.

According to an embodiment of the present application, the bonding promotion layer includes M or $MxO_n$, where M is at least one selected from Al, Ti, Ni and Mo, x is 1, 2 or 3, and n is an integer from 1 to 6. Specifically, in some embodiments, the bonding promotion layer may be a metal layer, specifically, an Al layer, a Ti layer, a Ni layer, or a Mo layer. In some other embodiments, the bonding promotion layer may be a metal oxide layer, and specifically iron oxide, alumina, titania, nickel oxide or molybdenum oxide. As a result, the bonding promotion layer has a strong bonding force to the metal frame and is uneasy to fall off, and the bonding promotion layer and the sealing layer have good infiltrability and strong bonding force, which is beneficial to obtaining an electronic device housing with good bonding effect. In addition, the bonding promotion layer of the above-mentioned composition can not only be similar to and intermiscible with the sealing layer to form better intermiscible bonding therebetween, but also have a well formed concave-convex structure and porous structure, to further improve the bonding strength and the usability of the housing. It can be appreciated by those skilled in the art that the specific composition of the bonding promotion layer may also depend on the material of the metal frame. For example, it may include the oxide of the corresponding metal forming the metal frame. For example, when the metal frame is an aluminum alloy, the bonding promotion layer may contain alumina or an oxide of an alloying element in the aluminum alloy.

According to an embodiment of the present application, the thickness of the bonding promotion layer is 1-10 micrometers, for example, the thickness of the bonding promotion layer may be 1 micrometer, 2 micrometers, 3 micrometers, 4 micrometers, 5 micrometers, 6 micrometers, 7 micrometers, 8 micrometers, 9 micrometers, and 10 micrometers, etc. Therefore, the bonding promotion layer has suitable thickness and aesthetic appearance, through which the metal frame and the sealing layer can be firmly bonded together. Moreover, the bonding promotion layer does not expand significantly under the influence of temperature, which is beneficial to prolonging the service life of the electronic device housing. Relative to the above-mentioned thickness range, when the thickness of the bonding promotion layer is too thin, it indicates that the pretreatment is relatively insufficient, so that the bonding promotion layer is close, in nature, to the bonding behavior of the metal frame, but insufficient in the bonding behavior of the inorganic back case (such as glass or ceramic), and the bonding force to the inorganic back case is relatively inadequate. When the thickness of the bonding promotion layer is too large, it indicates that the pretreatment is relatively excessive, so that the bonding promotion layer is close, in nature, to the bonding behavior of the inorganic back case, but insufficient in the bonding behavior of the metal frame, and tends to totally dissolve in the inorganic back case when sealed, and the bonding force to the metal frame is relatively inadequate.

In some embodiments of the present application, in order to improve the aesthetic extent of the frame, the frame can be decorated by, for example, treating the frame by at least one of polishing, sand blasting, wire drawing, coating by physical vapor deposition (PVD), laser carving, spraying, and anti-fingerprint coating (AF coating), to obtain a frame with a better decorative effect and further improve the aesthetic extent and utility of the frame.

According to an embodiment of the present application, the material forming the inorganic back case includes glass or ceramics. Therefore, the materials are readily available, the strength is high, and the signal is hardly shielded, which is beneficial to realizing the 5G and wireless charging functions. In some embodiments of the present application, the material forming the inorganic back case is at least one selected from chemically and physically strengthened high-alumina glass, $ZrO_2(3Y)$ ceramic with phase transformation toughening property, and $ZrO_2(3Y)$—$Al_2O_3$ ceramic with phase transformation toughening property. According to an embodiment of the present application, the material forming the glass back case includes chemically and physically strengthened high-alumina glass. As a result, the strength of the inorganic back case is high to better meet the needs of use, the service life is longer, and the signal transmission rate is higher.

In some embodiments of the present application, in order to improve the aesthetic extent of the back case, the back case can be decorated by, for example, treating the back case by at least one of glazing, laser carving, coating by PVD, AF Coating, wire drawing, and polishing, to obtain a back case with a better decorative effect, and further improve the aesthetic extent and utility of the back case.

According to an embodiment of the present application, the shape of the back case may be 2-dimensional, 2.5-dimensional, or 3-dimensional, etc., so that the back case has an aesthetic appearance.

According to some embodiments of the present application, the frame is a ceramic frame, and the back case is a glass back case. Specifically, the material forming the ceramic frame is at least one selected from $ZrO_2(3Y)$ ceramic with phase transformation toughening property and $ZrO_2(3Y)$—$Al_2O_3$ ceramic with phase transformation toughening property, and the material forming the glass back case is selected from chemically and physically strengthened high-alumina glass, etc. As a result, it can better meet the needs of use, the appearance is aesthetic, the service life is longer, and the signal transmission rate is higher.

According to an embodiment of the present application, the materials forming the sub-sealing layers each independently include: a glass powder and a binder, where the glass powders in two adjacent sub-sealing layers have different compositions. For example, when the sealing layer includes two sub-sealing layers, one sub-sealing layer may include a borosilicate oxide-based glass powder, and the other sub-sealing layer may include a phosphate oxide-based glass powder; one sub-sealing layer may include a sulfide-based glass powder, and the other sub-sealing layer may include a borosilicate oxide-based glass powder; one sub-sealing layer may include a halide-based glass powder, and the other sub-sealing layer may include a borosilicate oxide-based glass powder; or one sub-sealing layer may include a borate-based glass powder, and the other sub-sealing layer may include a silicate oxide-based glass powder. In some other embodiments, both sub-sealing layers may include the same series of glass powder (such as a borosilicate oxide-based glass powder), but the glass powder has different components and/or contents. Specifically, it can be a borosilicate oxide-based glass powder where the oxides and/or other substances are in the same type, but the contents of various oxides and/or other substances are different, or it can be a borosilicate oxide-based glass powder where the oxides and/or other substances are in different types. As a result, the sealing layer can effectively firmly bond the frame and the back case together. Moreover, the composition of each sub-sealing layer can be adjusted to allow for a higher degree of match and compatibility between the thermal expansion coefficients of the layer structures, to obtain an electronic device housing with better usability and longer service life. Meanwhile, the multilayer structure of multiple sub-sealing layers can be easily observed by SEM line scan.

According to an embodiment of the present application, in order to further improve the bonding strength between the frame and the back case, the weight ratio of the glass powder to the binder in the material forming the sub-sealing layer is 88-92:8-12. As such, when the components are within the above content range, the bonding strength between the frame and the back case is higher, which is more conducive to the integration between the frame and the back case and thus the seamless and stepless bonding between the frame and the back case, making the appearance of the electronic device housing more aesthetic and beautiful. Furthermore, when the components of the sealing layer are within the above range, the thermal expansion coefficients between the sealing layer and the frame or the back case are allowed to have a high degree of match.

According to an embodiment of the present application, in the process of preparing the sub-sealing layer, the glass powder, the binder and a solvent can be mixed to form a sealing slurry, and then the sealing slurry is formed into the sub-sealing layer. The specific amount of the solvent is not particularly limited, and an appropriate amount of the solvent can be determined by those skilled in the art according to the fluidity of the sealing slurry forming the sub-sealing layer.

According to an embodiment of the present application, the glass powder does not contain lead. As a result, the glass powder has almost no harm to the human body and is environmentally friendly, thus being more likely to be preferred by consumers.

According to an embodiment of the present application, the glass powder includes at least one of a silicate oxide-based glass powder (such as high-silica glass, soda-lime glass, aluminosilicate glass, and borosilicate glass), a phosphate-based glass powder, a borate-based glass powder, a sulfide-based glass powder, and a halide-based glass powder. Therefore, the glass powder is readily available, has a strong bonding force, an appropriate expansion coefficient, and a better usability.

According to an embodiment of the present application, when the back case is a glass back case, in order to obtain an electronic device housing with a better performance and a flatter and more aesthetic appearance, the glass powder in the sealing layer is a low-melting glass powder. Specifically, the temperature at which the glass powder is completely molten is lower than the softening point of the glass back case. Therefore, when the frame and the back case are sealed, the temperature does not reach the softening point of the glass back case, and the glass back case will not be softened and deformed, so that the flatness, appearance and optical performance of the electronic device will not be affected, and no failures and defects will occur due to a too high temperature.

According to an embodiment of the present application, when the frame is a metal frame, in order to make the glass powder and the bonding promotion layer similar and intermiscible and improve the bonding strength, the specific compositions of the bonding promotion layer and the sealing layer can be adjusted as needed. In some specific embodiments of the present application, the bonding promotion layer includes a metal oxide layer (i.e. $M_xO_n$, where M is at least one of Fe, Al, Ti, Ni, and Mo, x is 1, 2 or 3, and n is an integer from 1 to 6) or a metal layer (i.e. M, where M is at least one of Al, Ti, Ni and Mo). Correspondingly, the glass powder can be at least one selected from a silicate oxide-based glass powder (such as high-silica glass, soda-lime glass, aluminosilicate glass, and borosilicate glass), a phosphate-based glass powder, a borate-based glass powder, a sulfide-based glass powder, and a halide-based glass powder. Therefore, the sealing layer and the bonding promotion layer can be made similar and intermiscible, which is conducive to the better mutual diffusion and penetration between the sealing layer and the bonding promotion layer and allows for a tighter bonding between the two, thereby facilitating the improvement of the bonding strength between the sealing layer and the bonding promotion layer.

According to an embodiment of the present application, the binder includes at least one of a silicate inorganic binder (for example, including, but not limited to, water glass, etc.) and water-based polyurethane. Therefore, the binder has a strong bonding effect, with which the glass powder can be effectively formed into a sealing slurry, and which helps to coat the sealing slurry onto the surface of the bonding promotion layer.

According to an embodiment of the present application, the solvent includes at least one of ethanol and water. As a result, the binder and the glass powder can be uniformly dispersed in the above-mentioned solvent, to form a firm bonding between the sealing layer, the bonding promotion layer, and the back case.

Figure 4:
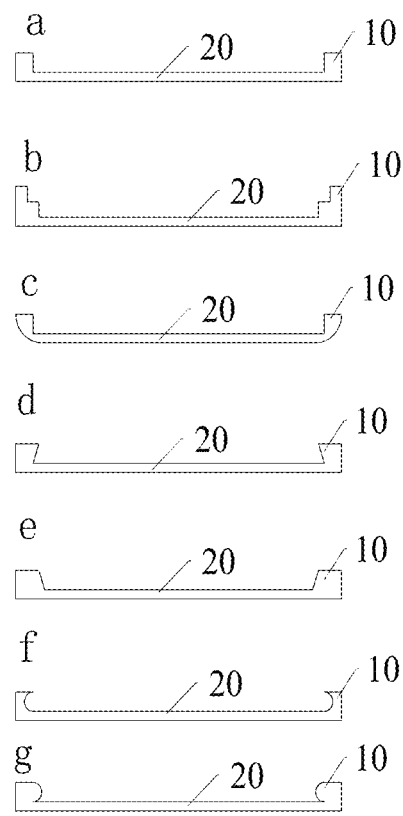
FIG. 4 is a schematic structural diagram of an electronic device housing according to some embodiments of the present application.

In the electronic device housing according to the embodiments of the present application, by means of transition by multiple sub-sealing layers with different components, the back case and the frame formed of different materials and having large difference in thermal expansion coefficients can be effectively bonded, and the housing has excellent bonding strength. Moreover, various complex shapes and structures can be achieved. Specifically, referring to FIG. 4 (the sealing layer is not shown in the figure), the position where the frame 10 and the back case 20 are bonded in the electronic device housing can have an inner right-angled structure (a in FIG. 4), an inner step structure (b in FIG. 4), a curved surface structure of the outer surface (c in FIG. 4) or a curved surface structure where the inner surface bulges outward (f in FIG. 4), and the inner surface of the frame can have a structure that gradually slopes inward (d in FIG. 4), a structure that gradually slopes outward (e in FIG. 4), or a curved structure that bulges inward (g in FIG. 4). In this way, various complex shapes can be achieved, to facilitate the assembly with internal components, or a special light and shadow effect can be realized.

In another aspect of this application, this application provides an electronic device. According to an embodiment of the present application, the electronic device includes a compound body or an electronic device housing as described above. The inventors find that the electronic device has a simple structure, is easy to implement, can attain 5G and wireless charging functions, and has a strong ability to receive or transmit signals, a long service life, all the features and advantages of the compound body or the electronic device housing as described above, and thus high market competitiveness.

According to an embodiment of this application, the electronic device includes at least one of a mobile phone, a tablet computer, a notebook computer, a VR (virtual reality) device, an AR (augmented reality) device, a wearable device, and a game console. Therefore, the scope of application is wide and can satisfy the consumers' consumption experience.

It should be noted that, in addition to the aforementioned electronic device housing, the electronic device may also include structures that a conventional electronic device needs to have. For example, when the electronic device is a mobile phone, referring to FIG. 2, it may also include a fingerprint module 21, a camera module 22, a control module 23, CPU, a connecting circuit, and a packaging structure, etc., which will not be repeated here.

Figure 5:
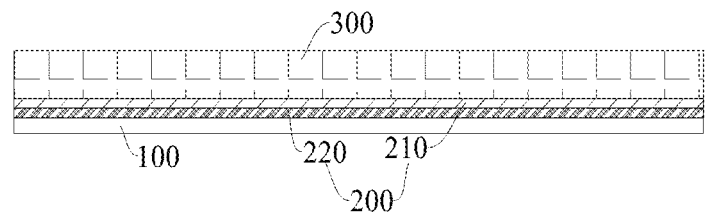
FIG. 5 is a schematic structural diagram of a compound body according to an embodiment of the present application.

This application provides a compound body. According to an embodiment of the present application, referring to FIG. 5, the compound body includes: a first workpiece 100; a sealing layer 200, disposed on an outer surface of the first workpiece 100, and including a plurality of sub-sealing layers laminated in sequence (where two sub-sealing layers 210 and 220 are taken as examples for description in FIG. 5), where two adjacent sub-sealing layers have different compositions; and a second workpiece 300, attached to the first workpiece 100 by the sealing layer 200. The inventors find that the bonding force between the first workpiece and the second workpiece in the compound body is strong. By providing the plurality of sub-sealing layers having different compositions, the thermal expansion coefficients can be flexibly adjusted by adjusting the compositions of the sub-sealing layers to form sub-sealing layers having small difference in the thermal expansion coefficients. This allows the thermal expansion coefficients to transition gradually from the first workpiece to the second workpiece, and have a high degree of match. The possibility of failures of the compound body due to temperature changes is significantly reduced, the mechanical properties are desirable, the service life is long, the appearance is aesthetic, the strength is high, and the signal shielding effect of the compound body is weak. Thus, the compound body is suitable for use in the production of electronic device housings.

Figure 6:
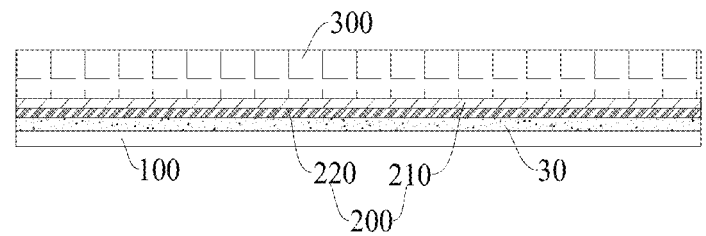
FIG. 6 is a schematic structural diagram of a compound body according to another embodiment of the present application.

According to an embodiment of the present application, referring to FIG. 6, the first workpiece is a metal piece, the second workpiece is an inorganic piece, and a bonding promotion layer 30 is also provided between the metal piece and the sealing layer. As a result, the compatibility between the metal piece and the sealing layer is better, and the bonding force is greater, which is conducive to obtaining a housing with better performance. In some embodiments of the present application, the material forming the metal piece includes stainless steel or aluminum alloy. Therefore, the metal piece has readily available sources, low price, high strength, and appropriate expansion coefficient, and is suitable for use in the production of a frame for an electronic device housing. In some embodiments of the present application, the stainless steel may be selected from at least one of SUS301 stainless steel, SUS304 stainless steel, and SUS316L stainless steel, or selected from at least one of the stainless steel designations S30110, S30408, S31603, and others in "GB/T 20878-2007 Stainless and heat-resisting steels—Designation and chemical composition". The aluminum alloy can be selected from 5052 aluminum alloy, 5182 aluminum alloy, 6063 aluminum alloy, 6061 aluminum alloy, 6013 aluminum alloy, the 7 series aluminum alloys with a zinc content in the range of 1%-10%, and so on.

According to an embodiment of the present application, the material forming the inorganic member includes glass or ceramic. Therefore, the inorganic piece has readily available sources, low price, appropriate expansion coefficient, and almost no signal shielding effect, thus being suitable for use in the production of a back case for an electronic device housing to facilitate the realization of 5G and wireless charging functions. The inorganic piece and the sealing layer are similar and intermiscible, and diffusion and infiltration will occur between the two when sealed. The sealing effect is better and the bonding strength is stronger, which is beneficial to the seamless bonding and integration. In some embodiments of the present application, the material forming the inorganic piece is at least one selected from chemically and physically strengthened high-alumina glass, $ZrO_2$ (3Y) ceramic with phase transformation toughening property, and $ZrO_2(3Y)$—$Al_2O_3$ ceramic with phase transformation toughening property.

According to an embodiment of the present application, the bonding promotion layer can be obtained by pretreatment on the surface of the metal piece. To obtain a bonding promotion layer with better performance, the pretreatment includes at least one of chemical vapor deposition and molten salt electrolysis. Therefore, the method of forming the bonding promotion layer is simple, convenient, and easy to implement. The composition, thickness, and others of the bonding promotion layer are the same as those of the bonding promotion layer described above, and will not be repeated here.

According to an embodiment of the present application, the first workpiece is a ceramic piece, and the second workpiece is a glass piece. Specifically, the material forming the ceramic piece is at least one selected from $ZrO_2(3Y)$ ceramic with phase transformation toughening property and $ZrO_2(3Y)$—$Al_2O_3$ ceramic with phase transformation toughening property, and the material forming the glass piece includes chemically and physically strengthened high-alumina glass. As a result, the first workpiece and the second workpiece have more appropriate expansion coefficient and higher strength to better meet the needs of use, the service life is longer, and the signal transmission rate is higher.

Figure 7:
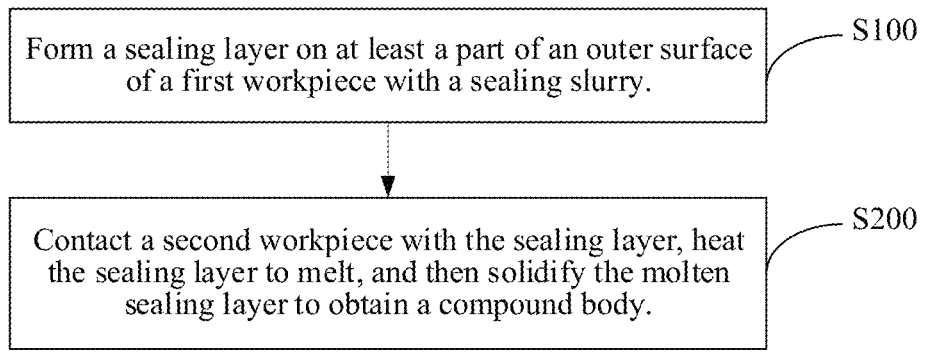
FIG. 7 is a schematic flow chart of a method for producing a compound body according to an embodiment of the present application.

In another aspect of this application, this application provides a method for producing a compound body. According to an embodiment of the present application, referring to FIG. 7, the method includes:

S100: Form a sealing layer on at least a part of an outer surface of a first workpiece with a sealing slurry.

According to an embodiment of the present application, the sealing slurry contains a glass powder. Therefore, the sealing layer formed by the sealing slurry has a strong bonding force, which is beneficial to the improvement of the bonding strength between the first workpiece and the second workpiece. The glass powder is as described above, and will not be repeated here.

According to an embodiment of the present application, the sealing slurry is formed by mixing the glass powder, a binder, and a solvent. The glass powder, the binder, and the solvent are as described above, and will not be repeated here. According to an embodiment of the present application, the sealing slurry includes 88-92 parts by weight of the glass powder, 8-12 parts by weight of the binder, and an appropriate amount of the solvent. According to an embodiment of the present application, the specific amount of the solvent is not particularly limited, and an appropriate amount of the solvent can be determined by those skilled in the art according to the fluidity of the sealing slurry forming the-sealing layer. Therefore, the sealing slurry has a good mixing effect and a high viscosity, which promotes the coating of the sealing slurry on the surface of the bonding promotion layer.

In some embodiments of the present application, each of the sub-sealing layers is formed by the step of coating the sealing slurry on a corresponding outer surface (the outer surface of the first workpiece or other sub-sealing layers), to obtain a sub-sealing layer. The above operation is repeated multiple times to obtain a sealing layer including multiple sub-sealing layers. Therefore, the operation is simple, convenient, and easy to implement, and a sealing layer with better performance can be obtained. In other embodiments of the present application, each of the sub-sealing layers is formed by the step of coating the sealing slurry on a corresponding outer surface (the outer surface of the first workpiece or other sub-sealing layers), to obtain a sealing slurry layer; and heating the sealing slurry layer to melt, and then solidifying the molten sealing slurry layer to obtain a sub-sealing layer. The coating step is repeated several times to form multiple sealing slurry layers, and then the multiple sealing slurry layers are heated to melt and then solidified, to obtain a sealing layer containing multiple sub-sealing layers. As such, the operation is simple, convenient, and easy to implement. The bonding strength between the sealing layer and the first workpiece is stronger, further facilitating the seamless bonding between the first workpiece and the second workpiece.

According to an embodiment of the present application, when the first workpiece is a metal workpiece, the method further includes, before forming the sealing layer, pretreating the first workpiece, to form a bonding promotion layer on at least a part of the surface of the first workpiece.

According to an embodiment of the present application, the method may further include, before the pretreatment of the first workpiece, the steps of degreasing, cleaning and drying the first workpiece. Thus, a clean surface of the first workpiece can be obtained, which is beneficial to the pretreatment on the surface of the first workpiece.

According to an embodiment of the present application, the first workpiece and the bonding promotion layer are as described above, and will not be repeated here.

According to an embodiment of the present application, the pretreatment includes at least one of an oxidation treatment and a coating treatment on the first workpiece. Therefore, the operation is simple, convenient, and easy to implement. A bonding promotion layer that has an appropriate expansion coefficient and is similar to and intermiscible with the sealing layer is formed, to facilitate the subsequent seamless bonding between the first workpiece and the second workpiece.

According to an embodiment of the present application, the coating treatment can be performed by at least one of chemical vapor deposition and molten salt electrolysis. Therefore, the operation is simple, convenient, and easy to implement. A bonding promotion layer with better performance can be obtained. According to an embodiment of the present application, when the pretreatment is performed by chemical vapor deposition, a metal layer or a metal oxide layer is deposited on the surface of the first workpiece. Therefore, the bonding force between the bonding promotion layer and the first workpiece and the sealing layer is stronger. According to an embodiment of the present application, when the pretreatment is performed by molten salt electrolysis, a metal layer is formed on the surface of the first workpiece alone. As a result, the formed bonding promotion layer has better performance, further facilitating the seamless bonding and integration of the first workpiece and the second workpiece.

In some embodiments of the present application, the specific operation for forming a bonding promotion layer by molten salt electrolysis may include immersing the first workpiece as a cathode in a molten salt, and electrolyzing the molt salt to obtain a thin layer of heterogeneous metal coating on the surface of the first workpiece. Thus, the operation is simple, convenient, and easy to implement, and a bonding promotion layer with better performance can be obtained.

According to an embodiment of the present application, the oxidation treatment can be a metal oxidation treatment method known in the art, by which the outer surface of the metal piece is directly oxidized to form a metal oxide layer. As a result, the bonding strength is much higher and the performance of the obtained housing is much better.

S200: Contact the second workpiece with the sealing layer, heat the sealing layer to melt, and then solidify the molten sealing layer to obtain a compound body.

According to an embodiment of the present application, the second workpiece is as described above, and will not be repeated here.

According to an embodiment of the present application, the temperature at which the sealing layer is completely melted is lower than the softening temperature of the second workpiece, whereby diffusion and infiltration occur between the sealing layer and the second workpiece. Therefore, the sealing effect is better, and a better bonding effect can be achieved with almost no damage of the second workpiece, making the appearance of the compound body more aesthetic. It should be noted that the temperature at which the sealing layer is completely melted refers to the lowest temperature when the sealing layer reaches complete melting, and the softening temperature of the second workpiece refers to the temperature at which the second workpiece starts to become softened.

According to an embodiment of the present application, the method for producing the compound body is simple, convenient, and easy to implement. The bonding promotion layer can be firmly attached to the sealing layer, to firmly bond the first workpiece and the second workpiece together. The compound body obtained has all the features and advantages mentioned above, which will not be repeated here. Moreover, this method is also suitable for use in the production of the electronic device housing, as long as the first workpiece is a frame and the second workpiece is a back case. The specific operations are completely the same.

Embodiments of this application are described in detail below.

Unless otherwise specified, in the following embodiments and comparative embodiment, the performances of the electronic device housing are tested by the following methods.

Performance test methods:
Bonding strength test: pull force test.
Specific operations are as follows:
Equipment: Universal Test Machine
Sample: The first workpiece and the second workpiece are cut into samples of 30 mm*12 mm*0.7 mm respectively. The bonded area (or the area of the sealing layer) of the first workpiece and the second workpiece is 6 mm*12 mm.

Figure 8:
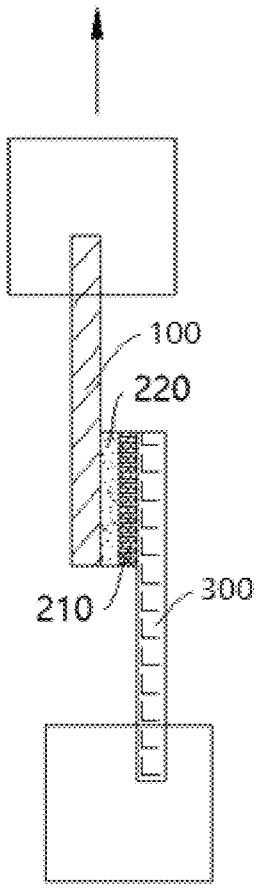
FIG. 8 is a schematic view of a test for bonding strength between a frame and a back case according to an embodiment of the present application.

Test method: The test sample is fixed on a test bench, and the universal test machine is loaded at a speed of 5 mm/min until the non-bonded part of the first workpiece or second workpiece is broken or the bonding surface falls off. The test is schematically shown in FIG. 8.

Characterization of multiple sub-sealing layers: SEM line scan.

Embodiment 1

Structure of Electronic Device Housing:
Metal frame: It is formed from stainless steel. The bonding promotion layer on the surface is a metal oxide layer (alumina layer), the thickness of the bonding promotion layer is 1 micron, and the method of forming the bonding promotion layer is chemical vapor deposition.

Sub-sealing layer 1: It includes 92 parts by weight of a borosilicate oxide-based glass powder, 8 parts by weight of a silicate-based inorganic binder, and a suitable amount of ethanol. The method of forming the sub-sealing layer 1 is to mix the raw materials to form a sealing slurry, coat it onto an outer surface of the bonding promotion layer; heat, melt and solidify to obtain a vitrified sub-sealing layer 1.

Sub-sealing layer 2: It includes 92 parts by weight of a phosphate oxide-based glass powder, 8 parts by weight of water-based polyurethane, and a suitable amount of water. The method of forming the sub-sealing layer 2 is to mix the raw materials to form a sealing slurry, and coat it onto an outer surface of the vitrified sub-sealing layer 1.

Inorganic back case: It is formed from high-alumina glass.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, the difference between the thermal expansion coefficients of the sub-sealing layer 2 and the inorganic back case is within ±10%, and the thermal expansion coefficients of the metal frame, the sub-sealing layer 1, the sub-sealing layer 2 and the inorganic back case gradually decrease.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Figure 9:
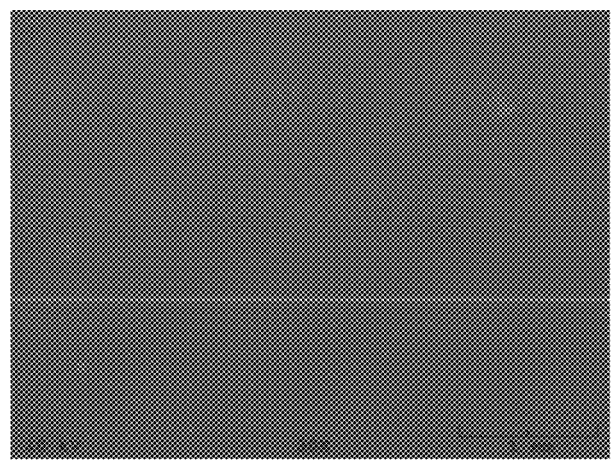
FIG. 9 is a scanning electron microscope (SEM) image of a cross section of a sealing layer according to an embodiment of the present application.
Figure 10:
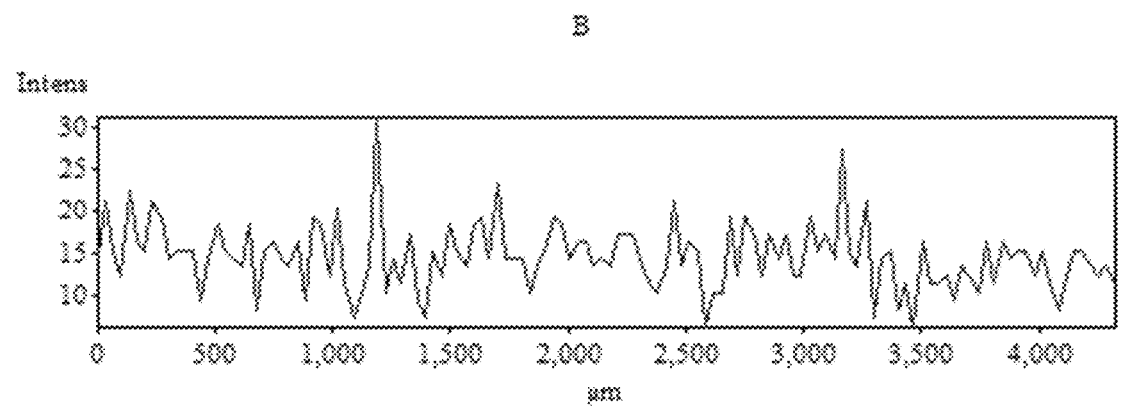
FIG. 10 is an SEM line-scan profile of a sub-sealing layer containing a borosilicate glass powder according to an embodiment of the present application.
Figure 11:
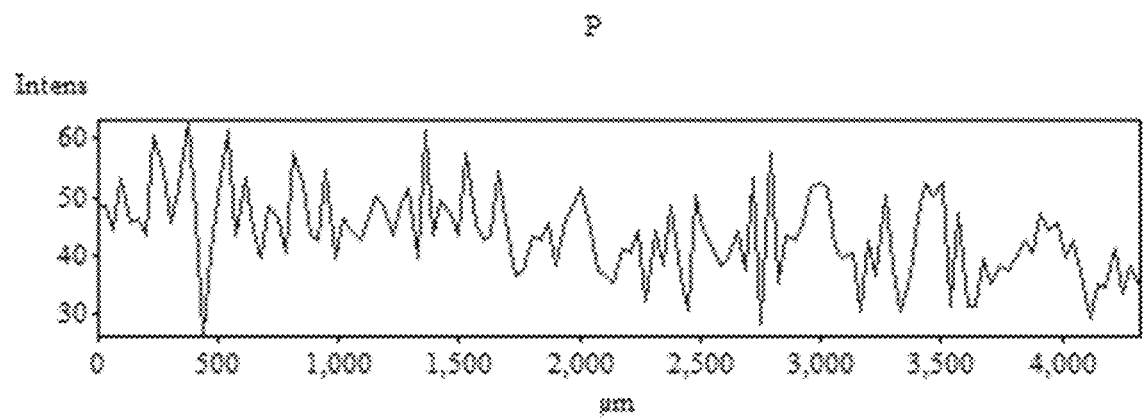
FIG. 11 is an SEM line-scan profile of a sub-sealing layer containing a phosphate glass powder according to an embodiment of the present application.

The shell is cut to obtain a cross section similar to that shown in FIG. 3. The position corresponding to the sealing layer is observed by scanning electron microscopy (SEM). FIG. 9 shows an SEM image. In FIG. 9, a portion above the horizontal line corresponds to the sub-sealing layer 2, and a portion below the horizontal line corresponds to the sub-sealing layer 1. Line scan is performed respectively on the sub-sealing layer 1 and the sub-sealing layer 2. The scan profiles are shown in FIGS. 10 and 11 respectively. It can be seen from FIGS. 9, 10 and 11 that there is no trace of sealing at the sealing position as observed at a magnification, and the sub-sealing layers of different compositions can be detected and characterized by SEM line scan.

Embodiment 2

Structure of Electronic Device Housing:
Metal frame: It is formed from an aluminum alloy. The bonding promotion layer on the surface is a metal oxide layer (titania layer), the thickness of the bonding promotion layer is 1 micron, and the method of forming the bonding promotion layer is chemical vapor deposition.

Sub-sealing layer 1: It includes 88 parts by weight of a borosilicate oxide-based glass powder, 12 parts by weight of a silicate-based inorganic binder, and a suitable amount of ethanol. The method of forming the sub-sealing layer 1 is to mix the raw materials to form a sealing slurry, coat it onto an outer surface of the bonding promotion layer; heat to melt, and solidify to obtain a sub-sealing layer 1.

Sub-sealing layer 2: It includes 88 parts by weight of a phosphate oxide-based glass powder, 12 parts by weight of water-based polyurethane, and a suitable amount of water. The method of forming the sub-sealing layer 2 is to mix the raw materials to form a sealing slurry, and coat it onto an outer surface of the vitrified sub-sealing layer 1.

Inorganic back case: It is formed from high-alumina glass.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Example 3

Structure of Electronic Device Housing:

Metal frame: It is formed from stainless steel. The bonding promotion layer on the surface is a metal oxide layer (nickel oxide), the thickness of the bonding promotion layer is 5 microns, and the method of forming the bonding promotion layer is chemical vapor deposition.

Sub-sealing layer 1: It includes 90 parts by weight of a borosilicate oxide-based glass powder, 10 parts by weight of a silicate-based inorganic binder, and a suitable amount of ethanol. The method of forming the sub-sealing layer 1 is to mix the raw materials to form a sealing slurry, coat it onto an outer surface of the bonding promotion layer; heat, melt and solidify to obtain a vitrified sub-sealing layer 1.

Sub-sealing layer 2: It includes 90 parts by weight of a phosphate oxide-based glass powder, 10 parts by weight of water-based polyurethane, and a suitable amount of water. The method of forming the sub-sealing layer 2 is to mix the raw materials to form a sealing slurry, and coat it onto an outer surface of the vitrified sub-sealing layer 1.

Inorganic back case: It is formed from $ZrO_2$ (3Y) ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Example 4

Structure of Electronic Device Housing:

Metal frame: It is formed from an aluminum alloy. The bonding promotion layer on the surface is a metal oxide layer (molybdenum oxide), the thickness of the bonding promotion layer is 1 micron, and the method of forming the bonding promotion layer is chemical vapor deposition.

Sub-sealing layer 1: It includes 90 parts by weight of a borosilicate oxide-based glass powder, 10 parts by weight of a silicate-based inorganic binder, and a suitable amount of ethanol. The method of forming the sub-sealing layer 1 is to mix the raw materials to form a sealing slurry, coat it onto an outer surface of the bonding promotion layer; heat, melt and solidify to obtain a vitrified sub-sealing layer 1.

Sub-sealing layer 2: It includes 90 parts by weight of a phosphate oxide-based glass powder, 10 parts by weight of water-based polyurethane, and a suitable amount of water. The method of forming the sub-sealing layer 2 is to mix the raw materials to form a sealing slurry, and coat it onto an outer surface of the vitrified sub-sealing layer 1.

Inorganic back case: It is formed from $ZrO_2$ (3Y) ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Example 5

Structure of Electronic Device Housing:

Metal frame: It is formed from an aluminum alloy. The bonding promotion layer on the surface is a metal layer (aluminum layer), the thickness of the bonding promotion layer is 1 micron, and the method of forming the bonding promotion layer is chemical vapor deposition.

Sub-sealing layer 1: It includes 90 parts by weight of a sulfide-based glass powder, 10 parts by weight of waterborne polyurethane, and a suitable amount of water. The method of forming the sub-sealing layer 1 is to mix the raw materials to form a sealing slurry, coat it onto an outer surface of the bonding promotion layer, heat, melt and solidify to obtain a vitrified sub-sealing layer 1.

Sub-sealing layer 2: It includes 90 parts by weight of a borosilicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Inorganic back case: It is formed from $ZrO_2$ (3Y)—$Al_2O_3$ ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Example 6

Structure of electronic device housing:

Metal frame: It is formed from an aluminum alloy. The bonding promotion layer on the surface is a metal layer (titanium layer), the thickness of the bonding promotion layer is 10 microns, and the method of forming the bonding promotion layer is molten salt electrolysis.

Sub-sealing layer 1: It includes 90 parts by weight of a halide-based glass powder, 10 parts by weight of waterborne polyurethane, and a suitable amount of water. The method of forming the sub-sealing layer 1 is to mix the raw materials to form a sealing slurry, coat it onto an outer surface of the bonding promotion layer, heat, melt and solidify to obtain a vitrified sub-sealing layer 1.

Sub-sealing layer 2: It includes 90 parts by weight of a borosilicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Inorganic back case: It is formed from $ZrO_2$ (3Y)—$Al_2O_3$ ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Embodiment 7

Structure of Electronic Device Housing:

Metal frame: It is formed from stainless steel. The bonding promotion layer on the surface is a metal layer (nickel layer), the thickness of the bonding promotion layer is 10 microns, and the method of forming the bonding promotion layer is chemical vapor deposition.

Sub-sealing layer 1: It includes 90 parts by weight of a phosphate-based glass powder, 10 parts by weight of waterborne polyurethane, and a suitable amount of water. The method of forming the sub-sealing layer 1 is to mix the raw materials to form a sealing slurry, coat it onto an outer surface of the bonding promotion layer, heat, melt and solidify to obtain a vitrified sub-sealing layer 1.

Sub-sealing layer 2: It includes 90 parts by weight of a borosilicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Inorganic back case: It is formed from $ZrO_2(3Y)$—$Al_2O_3$ ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Embodiment 8

Structure of Electronic Device Housing:

Metal frame: It is formed from stainless steel. The bonding promotion layer on the surface is a metal layer (molybdenum layer), the thickness of the bonding promotion layer is 10 microns, and the method of forming the bonding promotion layer is molten salt electrolysis.

Sub-sealing layer 1: It includes 90 parts by weight of a borate-based glass powder, 10 parts by weight of waterborne polyurethane, and a suitable amount of water. The method of forming the sub-sealing layer 1 is to mix the raw materials to form a sealing slurry, coat it onto an outer surface of the bonding promotion layer, heat, melt and solidify to obtain a vitrified sub-sealing layer 1.

Sub-sealing layer 2: It includes 90 parts by weight of a silicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Inorganic back case: It is formed from $ZrO_2(3Y)$—$Al_2O_3$ ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Example 9

Structure of Electronic Device Housing:

Metal frame: It is formed from stainless steel. The bonding promotion layer on the surface is a metal layer (molybdenum layer), the thickness of the bonding promotion layer is 10 microns, and the method of forming the bonding promotion layer is molten salt electrolysis.

Sub-sealing layer 1: It includes 90 parts by weight of a borate-based glass powder, 10 parts by weight of waterborne polyurethane, and a suitable amount of water. The method of forming the sub-sealing layer 1 is to mix the raw materials to form a sealing slurry, coat it onto an outer surface of the bonding promotion layer, heat, melt and solidify to obtain a vitrified sub-sealing layer 1.

Sub-sealing layer 2: It includes 90 parts by weight of a silicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Sub-sealing layer 3: It includes 90 parts by weight of a phosphate-based glass powder, 10 parts by weight of water-based polyurethane, and a suitable amount of water. The method of forming the sub-sealing layer 3 is to mix the raw materials to form a sealing slurry, and coat it onto an outer surface of the vitrified sub-sealing layer 2.

Inorganic back case: It is formed from $ZrO_2(3Y)$—$Al_2O_3$ ceramic.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, the difference between the thermal expansion coefficients of the sub-sealing layer 2 and the sub-sealing layer 3 is within ±10%, and the difference between the thermal expansion coefficients of the sub-sealing layer 3 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Example 10

Structure of Electronic Device Housing:

Metal frame: It is formed from stainless steel. The bonding promotion layer on the surface is a metal oxide layer (alumina layer), the thickness of the bonding promotion layer is 1 micron, and the method of forming the bonding promotion layer is chemical vapor deposition.

Sub-sealing layer 1: It includes 92 parts by weight of a borosilicate oxide-based glass powder, 8 parts by weight of a silicate-based inorganic binder, and a suitable amount of ethanol. The method of forming the sub-sealing layer 1 is to mix the raw materials to form a sealing slurry, coat it onto an outer surface of the bonding promotion layer; heat, melt and solidify to obtain a vitrified sub-sealing layer 1.

Sub-sealing layer 2: It includes 88 parts by weight of a borosilicate oxide-based glass powder (the same glass powder as that used in the sub-sealing layer 1), 12 parts by weight of a silicate-based inorganic binder, and a suitable amount ethanol. The method of forming the sub-sealing layer 2 is to mix the raw materials to form a sealing slurry, and coat it onto an outer surface of the vitrified sub-sealing layer 1.

Inorganic back case: It is formed from high-alumina glass.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Embodiment 11

Structure of Electronic Device Housing:

Metal frame: It is formed from stainless steel. The bonding promotion layer on the surface is a metal oxide layer (alumina layer), the thickness of the bonding promotion layer is 1 micron, and the method of forming the bonding promotion layer is chemical vapor deposition.

Sub-sealing layer 1: It includes 92 parts by weight of an aluminosilicate oxide-based glass powder, 8 parts by weight of a silicate-based inorganic binder, and a suitable amount of ethanol. The method of forming the sub-sealing layer 1 is to mix the raw materials to form a sealing slurry, coat it onto an outer surface of the bonding promotion layer; heat, melt and solidify to obtain a vitrified sub-sealing layer 1.

Sub-sealing layer 2: It includes 92 parts by weight of a borosilicate oxide-based glass powder, 8 parts by weight of a silicate-based inorganic binder, and a suitable amount ethanol. The method of forming the sub-sealing layer 2 is to mix the raw materials to form a sealing slurry, and coat it onto an outer surface of the vitrified sub-sealing layer 1.

Inorganic back case: It is formed from high-alumina glass.

The difference between the thermal expansion coefficients of the bonding promotion layer and the metal frame is within ±10%, the difference between the thermal expansion coefficients of the bonding promotion layer and the sub-sealing layer 1 is within ±10%, the difference between the thermal expansion coefficients of the sub-sealing layer 1 and the sub-sealing layer 2 is within ±10%, the difference between the thermal expansion coefficients of the sub-sealing layer 2 and the inorganic back case is within ±10%.

The appearance of the electronic device housing of this embodiment is aesthetic, and beautiful. Seamless and stepless bonding between the metal frame and the inorganic back case is realized, and almost no signal is shielded. The bonding strength between the metal frame and the inorganic back case of the electronic device housing is 100 N or higher.

Embodiment 12

The structure of the electronic device housing is the same as that in Embodiment 1, except that the metal frame in this Embodiment does not include a bonding promotion layer on the surface.

The difference between the thermal expansion coefficients of the sub-sealing layer 1 and the metal frame is within ±10%, the difference between the thermal expansion coefficients of the sub-sealing layer 1 and the sub-sealing layer 2 is within ±10%, and the difference between the thermal expansion coefficients of the sub-sealing layer 2 and the inorganic back case is within ±10%.

The appearance of the electronic device housing of this embodiment is aesthetic. Seamless and stepless bonding between the metal frame and the inorganic back case is realized, and almost no signal is shielded. The bonding strength between the metal frame and the inorganic back case of the electronic device housing is 60-80 N.

Embodiment 13

Structure of Electronic Device Housing:

Ceramic frame: It is formed from $ZrO_2(3Y)$—$Al_2O_3$ ceramic.

Sub-sealing layer 1: It includes 90 parts by weight of a borate-based glass powder, 10 parts by weight of waterborne polyurethane, and a suitable amount of water. The method of forming the sub-sealing layer 1 is to mix the raw materials to form a sealing slurry, coat it onto an outer surface of a ceramic piece; heat, melt and solidify to obtain a vitrified sub-sealing layer 1.

Sub-sealing layer 2: It includes 90 parts by weight of a silicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Glass back case: It is formed from high-alumina glass.

The difference between the thermal expansion coefficients of the ceramic frame and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the glass back case is within ±10%.

The appearance of the electronic device housing of this embodiment is aesthetic, and beautiful. Seamless and stepless bonding between the ceramic frame and the glass back case is realized, and almost no signal is shielded. The bonding strength between the ceramic frame and the glass back case of the electronic device housing is 100 N or higher.

Embodiment 14

Structure of Electronic Device Housing:

Ceramic frame: It is formed from $ZrO_2$ (3Y) ceramic.

Sub-sealing layer 1: It includes 90 parts by weight of a borate-based glass powder, 10 parts by weight of waterborne polyurethane, and a suitable amount of water. The method of forming the sub-sealing layer 1 is to mix the raw materials to form a sealing slurry, coat it onto an outer surface of a ceramic piece; heat, melt and solidify to obtain a vitrified sub-sealing layer 1.

Sub-sealing layer 2: It includes 90 parts by weight of a silicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Glass back case: It is formed from high-alumina glass.

The difference between the thermal expansion coefficients of the ceramic frame and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the glass back case is within ±10%.

The appearance of the electronic device housing of this embodiment is aesthetic, and beautiful. Seamless and stepless bonding between the ceramic frame and the glass back case is realized, and almost no signal is shielded. The bonding strength between the ceramic frame and the glass back case of the electronic device housing is 100 N or higher.

Example 15

Structure of Electronic Device Housing:

Ceramic frame: It is formed from $ZrO_2(3Y)$—$Al_2O_3$ ceramic.

Sub-sealing layer 1: It includes 90 parts by weight of a borate-based glass powder, 10 parts by weight of waterborne polyurethane, and a suitable amount of water. The method of forming the sub-sealing layer 1 is to mix the raw materials to form a sealing slurry, coat it onto an outer surface of a ceramic piece; heat, melt and solidify to obtain a vitrified sub-sealing layer 1.

Sub-sealing layer 2: It includes 90 parts by weight of a silicate oxide-based glass powder, 10 parts by weight of a silicate-based inorganic binder, and a suitable amount of ethanol. The method of forming the sub-sealing layer 2 is to mix the raw materials to form a sealing slurry, and coat it onto an outer surface of the vitrified sub-sealing layer 1.

Sub-sealing layer 3: It includes 90 parts by weight of a phosphate-based glass powder, 10 parts by weight of water-based polyurethane, and a suitable amount of water. The method of forming the sub-sealing layer 3 is to mix the raw materials to form a sealing slurry, and coat it onto an outer surface of the vitrified sub-sealing layer 2.

Glass back case: It is formed from high-alumina glass.

The difference between the thermal expansion coefficients of the ceramic frame and the sub-sealing layer 1 is within ±10%, the difference between the thermal expansion coefficients of the sub-sealing layer 1 and the sub-sealing layer 2 is within ±10%, the difference between the thermal expansion coefficients of the sub-sealing layer 2 and the sub-sealing layer 3 is within ±10%, the difference between the thermal expansion coefficients of the sub-sealing layer 3 and the glass back case is within ±10%, and the thermal expansion coefficients of the ceramic frame, the sub-sealing layer 1, the sub-sealing layer 2, the sub-sealing layer 3 and the glass back case gradually decrease.

The appearance of the electronic device housing of this embodiment is aesthetic, and beautiful. Seamless and stepless bonding between the ceramic frame and the glass back case is realized, and almost no signal is shielded. The bonding strength between the ceramic frame and the glass back case of the electronic device housing is 100 N or higher.

Example 16

Structure of Electronic Device Housing:

Ceramic frame: It is formed from $ZrO_2$ (3Y) ceramic.

Sub-sealing layer 1: It includes 90 parts by weight of a borate-based glass powder, 10 parts by weight of waterborne polyurethane, and a suitable amount of water. The method of forming the sub-sealing layer 1 is to mix the raw materials to form a sealing slurry, coat it onto an outer surface of a ceramic piece; heat, melt and solidify to obtain a vitrified sub-sealing layer 1.

Sub-sealing layer 2: It includes 92 parts by weight of a borate-based glass powder (the same glass powder as that used in the sub-sealing layer 1), 8 parts by weight of waterborne polyurethane, and a suitable amount of water. The method of forming the sub-sealing layer 2 is to mix the raw materials to form a sealing slurry, and coat it onto an outer surface of the vitrified sub-sealing layer 1.

Glass back case: It is formed from high-alumina glass.

The difference between the thermal expansion coefficients of the ceramic frame and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the glass back case is within ±10%.

The appearance of the electronic device housing of this embodiment is aesthetic, and beautiful. Seamless and stepless bonding between the ceramic frame and the glass back case is realized, and almost no signal is shielded. The bonding strength between the ceramic frame and the glass back case of the electronic device housing is 100 N or higher.

Embodiment 17

Structure of Electronic Device Housing:

Ceramic frame: It is formed from $ZrO_2$ (3Y) ceramic.

Sub-sealing layer 1: It includes 90 parts by weight of a borosilicate oxide-based glass powder, 10 parts by weight of waterborne polyurethane, and a suitable amount of water. The method of forming the sub-sealing layer 1 is to mix the raw materials to form a sealing slurry, coat it onto an outer surface of a ceramic piece; heat, melt and solidify to obtain a vitrified sub-sealing layer 1.

Sub-sealing layer 2: It includes 90 parts by weight of an aluminosilicate oxide-based glass powder, 10 parts by weight of water-based polyurethane, and a suitable amount of water. The method of forming the sub-sealing layer 2 is to mix the raw materials to form a sealing slurry, and coat it onto an outer surface of the vitrified sub-sealing layer 1.

Glass back case: It is formed from high-alumina glass.

The difference between the thermal expansion coefficients of the ceramic frame and the sub-sealing layer 1 is within ±10%, the difference between the thermal expansion coefficients of the sub-sealing layer 1 and the sub-sealing layer 2 is within ±10%, and the difference between the thermal expansion coefficients of the sub-sealing layer 2 and the glass back case is within ±10%.

The appearance of the electronic device housing of this embodiment is aesthetic, and beautiful. Seamless and stepless bonding between the ceramic frame and the glass back case is realized, and almost no signal is shielded. The bonding strength between the ceramic frame and the glass back case of the electronic device housing is 100 N or higher.

Comparative Embodiment 1

This comparative embodiment is the same as Embodiment 1, except that the sealing layer is a single-layer structure including a borosilicate glass powder, the metal frame is aluminum alloy, the difference between the thermal expansion coefficients of the metal frame and the sealing layer is 30%, and the difference between the thermal expansion coefficients of the sealing layer and the inorganic back case is 20%. For the housing obtained in this comparative example, the difference between the thermal expansion coefficients of the metal frame and the back case is too large, and cracking tends to occur after sealing.

In the description of this application, it can be understood that, terms "first" and "second" are used only for a purpose of description, and shall not be construed as indicating or implying relative importance or implying a quantity of indicated technical features. Therefore, a feature limited by "first" or "second" may explicitly or implicitly include one or more of the features. In the descriptions of this application, "a plurality of" means two or more, unless otherwise definitely and specifically limited.

In the descriptions of this specification, descriptions of a reference term such as "an embodiment," "some embodiments," "an example," "a specific example," or "some examples" means that a feature, structure, material, or characteristic that is described with reference to the embodiment or the example is included in at least one embodiment or example of this application. In this specification, schematic descriptions of the foregoing terms are not necessarily directed at the same embodiment or example. Besides, the specific features, the structures, the materials or the characteristics that are described may be combined in proper manners in any one or more embodiments or examples. In addition, a person skilled in the art may integrate or combine different embodiments or examples described in the specification and features of the different embodiments or examples as long as they are not contradictory to each other.

Although the embodiments of this application have been shown and described above, it can be understood that, the foregoing embodiments are exemplary and should not be understood as limitation to this application. A person of ordinary skill in the art can make changes, modifications, replacements, or variations to the foregoing embodiments within the scope of this application.

What is claimed is:

1. An electronic device housing, comprising:
   a frame;
   a sealing layer, disposed on at least a part of an outer surface of the frame, and comprising a plurality of sub-sealing layers laminated in sequence; and
   a back case, attached to the frame by the sealing layer,
   wherein thermal expansion coefficients of the sub-sealing layers increase or decrease along a direction from the frame to the back case, each of the sub-sealing layers is formed with a material comprising a glass powder and a binder, a weight ratio of the glass powder to the binder is 88-92:8-12, and glass powders in two adjacent sub-sealing layers of the sub-sealing layers have different compositions.

2. The electronic device housing according to claim 1, wherein a thermal expansion coefficient of the sealing layer is smaller than one of a thermal expansion coefficient of the frame and a thermal expansion coefficient of the back case and is greater than the other one of the thermal expansion coefficient of the frame and the thermal expansion coefficient of the back case, a difference between the thermal expansion coefficient of the frame and the thermal expansion coefficient of the sealing layer is no more than 10% of the thermal expansion coefficient of the sealing layer, or a difference between the thermal expansion coefficient of the sealing layer and the thermal expansion coefficient of the back case is no more than 10% of the thermal expansion coefficient of the back case.

3. The electronic device housing according to claim 1, wherein the frame is a metal frame, and the back case is an inorganic back case; and wherein a bonding promotion layer is further disposed between the metal frame and the sealing layer.

4. The electronic device housing according to claim 3, wherein the bonding promotion layer meets at least one of the following:
   the bonding promotion layer and the sealing layer are similar and compatible;
   a surface of the bonding promotion layer away from the metal frame is provided with a concave-convex structure;
   the bonding promotion layer has a porous structure;
   the bonding promotion layer comprises M or $M_xO_n$, wherein M is at least one selected from Fe, Al, Ti, Ni and Mo, x is 1, 2 or 3, and n is an integer from 1 to 6; and
   the bonding promotion layer has a thickness of 1-10 μm.

5. The electronic device housing according to claim 3, wherein a material forming the metal frame comprises stainless steel or aluminum alloy; and a material forming the inorganic back case comprises glass or ceramic.

6. The electronic device housing according to claim 1, wherein the frame is a ceramic frame, and the back case is a glass back case.

7. The electronic device housing according to claim 1, wherein the glass powder meets at least one of the following:
the glass powder is free of lead; and
the glass powder comprises at least one of a silicate oxide-based glass powder, a phosphate-based glass powder, a borate-based glass powder, a sulfide-based glass powder, and a halide-based glass powder.

8. An electronic device, comprising an electronic device housing according to claim 1.

9. A compound body, comprising:
a first workpiece;
a sealing layer, disposed on at least a part of an outer surface of the first workpiece, and comprising a plurality of sub-sealing layers laminated in sequence; and
a second workpiece, attached to the first workpiece by the sealing layer, wherein thermal expansion coefficients of the sub-sealing layers increase or decrease along a direction from the first workpiece to the second workpiece, each of the sub-sealing layers is formed with a material comprising a glass powder and a binder, a weight ratio of the glass powder to the binder is 88-92:8-12, and glass powders in two adjacent sub-sealing layers of the sub-sealing layers have different compositions.

10. The compound body according to claim 9, wherein a thermal expansion coefficient of the sealing layer is between a thermal expansion coefficient of the first workpiece and a thermal expansion coefficient of the second workpiece, and a difference between the thermal expansion coefficient of the first workpiece and the thermal expansion coefficient of the sealing layer is within ±10% of the thermal expansion coefficient of the sealing layer, or a difference between the thermal expansion coefficient of the sealing layer and the thermal expansion coefficient of the second workpiece is within ±10% of the thermal expansion coefficient of the second workpiece.

11. The compound body according to claim 9, wherein the first workpiece is a metal piece, and the second workpiece is an inorganic piece, and wherein a bonding promotion layer is further disposed between the metal piece and the sealing layer.

12. The compound body according to claim 11, wherein the bonding promotion layer meets at least one of the following:
the bonding promotion layer and the sealing layer are similar and compatible;
a surface of the bonding promotion layer away from the metal piece is provided with a concave-convex structure;
the bonding promotion layer has a porous structure;
the bonding promotion layer comprises M or $M_xO_n$, wherein M is at least one selected from Fe, Al, Ti, Ni and Mo, x is 1, 2 or 3, and n is an integer from 1 to 6; and
the bonding promotion layer has a thickness of 1-10 µm.

13. The compound body according to claim 11, wherein a material forming the metal piece comprises stainless steel or aluminum alloy; and a material forming the inorganic piece comprises glass or ceramic.

14. The compound body according to claim 9, wherein the first workpiece is a ceramic piece, and the second workpiece is a glass piece.

15. The compound body according to claim 9, wherein the glass powder meets at least one of the following:
the glass powder is free of lead; and
the glass powder comprises at least one of a silicate oxide-based glass powder, a phosphate-based glass powder, a borate-based glass powder, a sulfide-based glass powder, and a halide-based glass powder.

* * * * *